United States Patent
Wei et al.

(10) Patent No.: US 12,396,142 B2
(45) Date of Patent: Aug. 19, 2025

(54) FAN BOX, SERVER SYSTEM, AND METHOD FOR ADJUSTING ROTATION SPEED OF FAN BOX

(71) Applicant: HUAWEI TECHNOLOGIES CO., LTD., Shenzhen (CN)

(72) Inventors: Dongdong Wei, Shenzhen (CN); Yuanjun Niu, Xi'an (CN); An Li, Xi'an (CN)

(73) Assignee: Huawei Technologies Co., Ltd, Shenzhen (CN)

(*) Notice: Subject to any disclaimer, the term of this patent is extended or adjusted under 35 U.S.C. 154(b) by 104 days.

(21) Appl. No.: 18/332,381

(22) Filed: Jun. 9, 2023

(65) Prior Publication Data

US 2023/0389238 A1  Nov. 30, 2023

Related U.S. Application Data

(63) Continuation of application No. PCT/CN2021/128627, filed on Nov. 4, 2021.

(30) Foreign Application Priority Data

Dec. 10, 2020 (CN) .......................... 202011455591.3

(51) Int. Cl.
  *H05K 7/20* (2006.01)
  *F04D 27/00* (2006.01)

(52) U.S. Cl.
  CPC ....... *H05K 7/20836* (2013.01); *F04D 27/004* (2013.01); *H05K 7/20718* (2013.01)

(58) Field of Classification Search
  None
  See application file for complete search history.

(56) References Cited

U.S. PATENT DOCUMENTS

| 2012/0136489 A1 | 5/2012 | Wang et al. |
| 2013/0288588 A1 | 10/2013 | Shih et al. |
| 2013/0289793 A1 | 10/2013 | Pan et al. |

(Continued)

FOREIGN PATENT DOCUMENTS

| CN | 1963233 A | 5/2007 |
| CN | 104122910 A | 10/2014 |
| CN | 105041696 A | 11/2015 |

*Primary Examiner* — Courtney D Heinle
*Assistant Examiner* — Danielle M. Christensen
(74) *Attorney, Agent, or Firm* — Leydig, Voit & Mayer, Ltd.

(57) ABSTRACT

This application discloses a fan box, a server system, and a method for adjusting a rotation speed of a fan box, and belongs to the field of server heat dissipation technologies. The fan box provided in embodiments of this application has a plurality of communication interfaces, and each communication interface can be electrically connected to one server board. Therefore, the fan box provided in embodiments of this application can be electrically connected to a plurality of server boards. In addition, a controller in the fan box can adjust a rotation speed of a fan based on a plurality of fan box speed adjustment instructions. Therefore, the fan box provided in embodiments of this application can be controlled by a plurality of master control nodes, and is applicable to a multi-node server system with a central management unit-free architecture, and any server system that requires multi-node master control.

10 Claims, 3 Drawing Sheets

(56) References Cited

U.S. PATENT DOCUMENTS

2014/0222211 A1* 8/2014 Wei ................. G05B 15/02
   700/275
2014/0362526 A1* 12/2014 Wang ............... H05K 7/20836
   361/679.48

* cited by examiner

FAN BOX, SERVER SYSTEM, AND METHOD FOR ADJUSTING ROTATION SPEED OF FAN BOX

CROSS-REFERENCE TO RELATED APPLICATIONS

This application is a continuation of International Application No. PCT/CN2021/128627, filed on Nov. 4, 2021, which claims priority to Chinese Patent Application No. 202011455591.3, filed on Dec. 10, 2020. The disclosures of the aforementioned applications are hereby incorporated by reference in their entireties.

TECHNICAL FIELD

This application relates to the field of server heat dissipation technologies, and in particular, to a fan box, a server system, and a method for adjusting a rotation speed of a fan box.

BACKGROUND

A multi-node server refers to a server that has a plurality of server boards. The plurality of server boards of the multi-node server include a central management board for managing other server boards. A multi-node server is generally cooled by a fan box, and the central management board is electrically connected to the fan box. The central management board can obtain a temperature value of each server board, and adjust a rotation speed of a fan in the fan box based on the temperature value.

With increasing demand for server space utilization, a multi-node server with a central management unit-free architecture emerges. The multi-node server does not have a central management board, and therefore, space utilization is higher than that of the multi-node server with a central management board.

However, because a multi-node server with a central management unit-free architecture no longer has a central management board, a fan box connected to the central management board in a related technology is no longer applicable. Therefore, a new fan box needs to be designed for the multi-node server with a central management unit-free architecture.

SUMMARY

Embodiments of this application provide a fan box, a server system, and a method for adjusting a rotation speed of a fan box. The fan box includes a plurality of communication interfaces, can be electrically connected to a plurality of server boards, and can be applied to a multi-node server in a center management unit-free architecture. Technical solutions of the fan box, the server system, and the method for adjusting a rotation speed of a fan box are described as follows.

According to a first aspect, a fan box is provided. The fan box includes a fan box control board and at least one fan. The fan box control board includes a controller and a plurality of communication interfaces, the controller is electrically connected to the plurality of communication interfaces, and the controller is electrically connected to the at least one fan. The controller is configured to receive a plurality of fan box speed adjustment instructions through the plurality of communication interfaces, determine a target rotation speed based on rotation speeds indicated by the plurality of fan box speed adjustment instructions, and adjust a rotation speed of the at least one fan to the target rotation speed, where one communication interface of the plurality communication interfaces receives one fan box instruction.

The fan box provided in embodiments of this application has a plurality of communication interfaces, and each communication interface is configured to receive one fan box speed adjustment instruction of a server board. Therefore, the fan box can be controlled by a plurality of server boards. For example, when controlling the fan box, the plurality of server boards all serve as master control nodes to control the fan box, and consider the fan box as a local fan box, that is, the plurality of server boards can equally control the fan box. In this case, the fan box provided in embodiments of this application may also be referred to as an intelligent fan box supporting multi-master control.

The fan box control board is a control unit of the fan box, including a board body, and a controller and communication interfaces located on the board body.

The controller is a control center of the fan box, and may be a central processing unit (CPU), or may be a field programmable gate array (FPGA), or the like.

The communication interface is an external interface of the fan box, and each communication interface can be electrically connected to one server board, so that the fan box can be electrically connected to a plurality of server boards.

The fan is an execution part of the fan box and is configured to generate air for heat dissipation. One or more fans may be provided. This is not specifically limited in embodiments of this application.

In the solution shown in embodiments of this application, a fan box is designed to include a plurality of communication interfaces, and each communication interface is configured to be electrically connected to one server board, so that the fan box provided in embodiments of this application can be electrically connected to a plurality of server boards. In addition, a controller in the fan box can adjust a rotation speed of the fan based on a plurality of fan box speed adjustment instructions. Therefore, the fan box provided in embodiments of this application is applicable to a multi-node server system of a center management unit-free architecture and any server system that requires multi-node master control.

In a possible implementation, when determining the target rotation speed based on the rotation speeds indicated by the plurality of fan box speed adjustment instructions, the controller is configured to determine a largest rotation speed in the rotation speeds indicated by the plurality of fan box speed adjustment instructions as the target rotation speed.

In the solution shown in embodiments of this application, the rotation speed of the fan is adjusted to the largest rotation speed in the rotation speeds indicated by the plurality of fan box speed adjustment instructions, so that the heat dissipation air volume generated by the fan box can meet heat dissipation requirements of all server boards.

In a possible implementation, when determining the target rotation speed based on the speeds indicated by the plurality of fan box speed adjustment instructions, the controller is configured to determine the target rotation speed based on a rotation speed greater than a target rotation speed threshold in the speeds indicated by the plurality of fan box speed adjustment instructions; or determine the target rotation speed threshold as the target rotation speed when the speeds indicated by the plurality of fan box speed adjustment instructions are all less than the target rotation speed threshold.

The target rotation speed threshold may be a minimum rotation speed specified by the fan. During running of the fan box, the fan rotates at a rotation speed greater than or equal to the target rotation speed threshold.

In the solution shown in embodiments of this application, when the target rotation speed is determined based on the rotation speed indicated by the fan box speed adjustment instruction, only a rotation speed greater than the target rotation speed threshold in the rotation speeds indicated by the fan box speed adjustment instruction may be considered, and a rotation speed less than the target rotation speed threshold is discarded, so that the determined target rotation speed can be prevented from being less than the target rotation speed threshold.

In embodiments of this application, a specific manner of determining the target rotation speed based on a rotation speed greater than the target rotation speed threshold in the rotation speeds indicated by the plurality of fan box speed adjustment instructions is not limited. For example, a largest rotation speed in rotation speeds greater than the target rotation speed threshold may be determined as the target rotation speed, or rotation speeds greater than the target rotation speed threshold may be averaged, and the average rotation speed is determined as the target rotation speed, or a median of rotation speeds greater than the target rotation speed threshold may be calculated, and a rotation speed in the median is determined as the target rotation speed.

When the rotation speeds indicated by the plurality of fan box speed adjustment instructions are all less than the target rotation speed threshold, the target rotation speed threshold is determined as the target rotation speed, to prevent a rotation speed of the fan from being less than the target rotation speed threshold.

In a possible implementation, the controller is further configured to detect that external communication of the plurality of communication interfaces is interrupted, and adjust a rotation speed of the at least one fan based on a temperature value of the fan box.

A mode in which the fan box adjusts the rotation speed of the fan based on the received fan box speed adjustment instruction may be referred to as a node control mode of the fan box, and a mode in which the fan box adjusts the rotation speed of the fan based on the temperature value of the fan box may be referred to as an automatic control mode of the fan box.

In the solution shown in embodiments of this application, after detecting that external communication of the plurality of communication interfaces is interrupted, the fan box is designed to enter the automatic control mode because the fan box cannot receive the fan box speed adjustment instruction sent by the server board. This can avoid a situation that the fan box cannot adjust a rotation speed or even stops rotating because the fan box cannot receive the fan box speed adjustment instruction, thereby preventing the server board and the server system from failing due to overheating.

In a possible implementation, the fan box control board further includes a temperature sensor. The temperature sensor is electrically connected to the controller, and the temperature sensor is configured to detect a temperature value of the fan box. Before adjusting the rotation speed of the at least one fan based on the temperature value of the fan box, the controller is further configured to obtain the temperature value detected by the temperature sensor.

In the solution shown in embodiments of this application, the temperature value of the fan box may be obtained through detection by a temperature sensor located on a fan box control board.

In a possible implementation, the controller is further configured to: receive an upgrade instruction sent by a first server board, where the upgrade instruction indicates the fan box to perform an upgrade operation; and send a status indication message to a second server board, where the status indication message indicates that the fan box is performing the upgrade operation, so that the second server board does not send the upgrade instruction, the fan box speed adjustment instruction, or another instruction to the fan box, where both the first server board and the second server board are electrically connected to the fan box.

The first server board and the second server board are not a same server board, and the second server board is one or more server boards that are electrically connected to the fan box and that are other than the first server board.

In the solution shown in embodiments of this application, the fan box is designed to send the status indication message to the second server board, so that the fan box does not receive an instruction sent by the second server board during upgrade operation, thereby avoiding interfering with the upgrade operation of the fan box.

For example, through the foregoing design, the plurality of server boards do not perform the upgrade operation on the fan box at a same moment, thereby avoiding an upgrade conflict of the fan box.

According to a second aspect, a server system is provided. The server system includes at least one fan box and a plurality of server boards. The fan box is electrically connected to the plurality of server boards. Each server board is configured to send a fan box speed adjustment instruction to the fan box based on a detected board temperature value. The fan box is configured to adjust a rotation speed of the fan box based on a plurality of received fan box speed adjustment instructions.

The board temperature value refers to a temperature value of the server board, and may be a temperature value detected by a temperature sensor arranged on the server board.

The server system provided in embodiments of this application may be a blade server system (or referred to as a blade server), or may be a rack server system, or the like. This is not limited in embodiments of this application. The fan box in the server system may be the fan box provided in the first aspect.

The server board may also be referred to as a node. The server board is electrically connected to the fan box. For example, the server board may provide N southbound interface components to communicate with N fan boxes, where N is a positive integer. The server board can detect the board temperature value, generate a fan box speed adjustment instruction based on the board temperature value, and send the instruction to the fan box.

The fan box can generate air for heat dissipation, and can adjust a rotation speed of a fan based on the fan box speed adjustment instruction of the server board. The fan box is electrically connected to at least two server boards. For example, each fan box may provide M northbound interfaces to communicate with M server boards, where M is a positive integer greater than 1.

According to the solution shown in embodiments of this application, embodiments of this application provide a new server system. In the server system, each fan box is electrically connected to all server boards. When controlling the fan box, each server board considers the fan box as a local fan box. A plurality of server boards provide equal management for the fan box without fixing a shelf management unit (a central management board), thereby improving high integration and high space utilization of the server system.

In addition, the fan box is set to be electrically connected to all server boards in the server system, so that redundancy and reliability of the server system are increased. During running of the server system, if any server board fails or exits, normal running of the fan box is not affected, and reliability of heat dissipation of the server system is improved.

In a possible implementation, the server system is a blade server, and the at least one fan box is fixedly connected to a shelf of the blade server.

According to a third aspect, a method for adjusting a rotation speed of a fan box is provided. The fan box includes a plurality of communication interfaces. The method includes: receiving a plurality of fan box speed adjustment instructions through the plurality of communication interfaces, where one communication interface of the plurality of communication interfaces receives one fan box speed adjustment instruction; determining a target rotation speed based on rotation speeds indicated by the plurality of fan box speed adjustment instructions; and adjusting a rotation speed of the fan box to the target rotation speed.

The method for adjusting a rotation speed of a fan box provided in embodiments of this application may be applied to the fan box according to the first aspect. The rotation speed of the fan box refers to a rotation speed of a fan in the fan box.

According to the solution shown in embodiments of this application, the fan box provided in embodiments of this application has a plurality of communication interfaces, and each communication interface can receive a fan box speed adjustment instruction of one server board. Therefore, the fan box can be controlled by a plurality of server boards. For example, when controlling the fan box, the plurality of server boards all serve as master control nodes to control the fan box, and consider the fan box as a local fan box, that is, the plurality of server boards can equally control the fan box. In this case, the fan box provided in embodiments of this application may also be referred to as an intelligent fan box supporting multi-master control.

In a possible implementation, the determining a target rotation speed based on rotation speeds indicated by the plurality of fan box speed adjustment instructions includes: determining a largest rotation speed in the rotation speeds indicated by the plurality of fan box speed adjustment instructions as the target rotation speed.

In the solution shown in embodiments of this application, the rotation speed of the fan box is adjusted to a largest rotation speed in the rotation speeds indicated by the plurality of fan box speed adjustment instructions, so that the heat dissipation air volume generated by the fan box can meet heat dissipation requirements of all server boards.

In a possible implementation, the determining a target rotation speed based on rotation speeds indicated by the plurality of fan box speed adjustment instructions includes: determining the target rotation speed based on a rotation speed greater than a target rotation speed threshold in the rotation speeds indicated by the plurality of fan box speed adjustment instructions; or determining the target rotation speed threshold as the target rotation speed when the rotation speeds indicated by the plurality of fan box speed adjustment instructions are all less than the target rotation speed threshold.

The target rotation speed threshold may be a minimum rotation speed specified by the fan. During running of the fan box, the fan rotates at a rotation speed greater than or equal to the target rotation speed threshold.

In the solution shown in embodiments of this application, when the target rotation speed is determined based on the rotation speed indicated by the fan box speed adjustment instruction, only a rotation speed greater than the target rotation speed threshold in the rotation speeds indicated by the fan box speed adjustment instruction may be considered, and a rotation speed less than the target rotation speed threshold is discarded, so that the determined target rotation speed can be prevented from being less than the target rotation speed threshold.

In embodiments of this application, a specific manner of determining the target rotation speed based on a rotation speed greater than the target rotation speed threshold in the rotation speeds indicated by the plurality of fan box speed adjustment instructions is not limited. For example, a largest rotation speed in rotation speeds greater than the target rotation speed threshold may be determined as the target rotation speed, or rotation speeds greater than the target rotation speed threshold may be averaged, and the average rotation speed is determined as the target rotation speed, or a median of rotation speeds greater than the target rotation speed threshold may be calculated, and a rotation speed in the median is determined as the target rotation speed.

When the rotation speeds indicated by the plurality of fan box speed adjustment instructions are all less than the target rotation speed threshold, the target rotation speed threshold is determined as the target rotation speed, to prevent a rotation speed of a fan from being less than the target rotation speed threshold.

In a possible implementation, the method further includes: receiving an upgrade instruction sent by a first server board, where the upgrade instruction indicates the fan box to perform an upgrade operation; and sending a status indication message to a second server board, where the status indication message indicates that the fan box is performing the upgrade operation, so that the second server board does not send the upgrade instruction, the fan box speed adjustment instruction, or another instruction to the fan box, where both the first server board and the second server board are electrically connected to the fan box.

The first server board and the second server board are not a same server board, and the second server board is one or more server boards that are electrically connected to the fan box and that are other than the first server board.

In the solution shown in embodiments of this application, the fan box is designed to send the status indication message to the second server board, so that the fan box does not receive an instruction sent by the second server board during upgrade operation, thereby avoiding interfering with the upgrade operation of the fan box.

For example, through the foregoing design, the plurality of server boards do not perform the upgrade operation on the fan box at a same moment, thereby avoiding an upgrade conflict of the fan box.

According to a fourth aspect, a method for adjusting a rotation speed of a fan box is provided. The fan box includes a plurality of communication interfaces. The method includes: receiving a plurality of fan box speed adjustment instructions through the plurality of communication interfaces, determining a target rotation speed based on rotation speeds indicated by the plurality of fan box speed adjustment instructions, and adjusting a rotation speed of the fan box to the target rotation speed, where one communication interface of the plurality of communication interfaces receives one fan box speed adjustment instruction; or, when external communication of the plurality of communication interfaces is interrupted, adjusting the rotation speed of the fan box based on a temperature value of the fan box.

The method for adjusting a rotation speed of a fan box provided in embodiments of this application may be applied to the fan box according to the first aspect. The rotation speed of the fan box refers to a rotation speed of a fan in the fan box.

A mode in which the fan box adjusts the rotation speed based on the received fan box speed adjustment instruction may be referred to as anode control mode of the fan box, and a mode in which the fan box adjusts the rotation speed based on a temperature value of the fan box, may be referred to as an automatic control mode of the fan box.

In the solution shown in embodiments of this application, when the external communication of the plurality of communication interfaces is normal, the fan box enters the node control mode, and adjusts a rotation speed under control of a plurality of nodes.

When the external communication of the plurality of communication interfaces is interrupted, the fan box enters the automatic control mode and adjusts the rotation speed of the fan box based on the temperature value of the fan box. In the automatic control mode, the fan box can adjust the rotation speed of the fan based on the temperature value of the fan box, to avoid a situation that the fan box cannot adjust the rotation speed of the fan or even stops rotating because the fan box cannot receive a speed adjustment instruction of the fan box, thereby preventing the server board and the server system from being faulty due to overheating.

In a possible implementation, the fan box further includes a temperature sensor, and before adjusting the rotation speed of the fan box based on a temperature value of the fan box, the method further includes: obtaining the temperature value of the fan box detected by the temperature sensor.

In the solution shown in embodiments of this application, the temperature value of the fan box may be obtained through detection by a temperature sensor of the fan box.

According to a fifth aspect, a computer-readable storage medium is provided. The computer-readable storage medium includes instructions, and when the computer-readable storage medium runs on a fan box, the fan box is enabled to perform the method according to the third aspect or the fourth aspect.

According to a sixth aspect, a computer program product including instructions is provided, and when the computer program product runs on a fan box, the fan box performs the method according to the third aspect or the fourth aspect.

According to a seventh aspect, a chip is provided. The chip includes a programmable logic circuit and/or program instructions. When the chip runs, the chip is configured to implement the method according to the third aspect or the fourth aspect.

Beneficial effects brought by the technical solutions provided in embodiments of this application are as follows.

Embodiments of this application provide a fan box. The fan box includes a plurality of communication interfaces, and each communication interface can be electrically connected to one server board. Therefore, the fan box provided in embodiments of this application can be electrically connected to a plurality of server boards. In addition, a controller in the fan box can adjust a rotation speed of a fan based on a plurality of fan box speed adjustment instructions. Therefore, the fan box provided in embodiments of this application is applicable to a multi-node server system of a center management unit-free architecture, and any server system that requires multi-node master control.

DESCRIPTION OF REFERENCE NUMERALS

1. fan box, 11. fan box control board, 111. controller, 112. communication interface, 113. temperature sensor, 114. clock circuit, 115. power supply soft-start circuit, and 12. fan; and 2. server board, 20. heat dissipation area.

DESCRIPTION OF EMBODIMENTS

With rapid increase of service requirements and scale expansion of the Internet, high performance computing (HPC), edge computing, Internet service provider (ISP), and data center, a multi-node server (or referred to as a multi-node blade server, which is a server including a plurality of server boards, and each server board corresponds to one node) featuring flexible expansion, high density, high reliability, easy maintenance and management, high efficiency and energy conservation, and high space utilization is applied more widely. With gradual application of multi-node servers, system integration becomes increasingly high, and ultra-high density and high space utilization of servers have become a trend. How to improve space utilization of servers is a major challenge for server vendors.

A multi-node server of a central management unit-free architecture emerges. This type of multi-node server can implement high space utilization of the multi-node server through the central management unit-free architecture. Each node provides a multi-node management plane through a MESH interconnection architecture. A shelf management unit is deployed on a plurality of blade nodes through a distributed virtual shelf management module (vSMM). All nodes are homogeneous (have same functions). All nodes can implement a management service function of the shelf.

To meet a heat dissipation requirement of a multi-node server in a central management unit-free architecture, embodiments of this application provide a fan box with a new architecture. The fan box can be applied to the multi-node server in the central management unit-free architecture, and is controlled by a plurality of nodes. The following describes a structure of the fan box.

Figure 1:
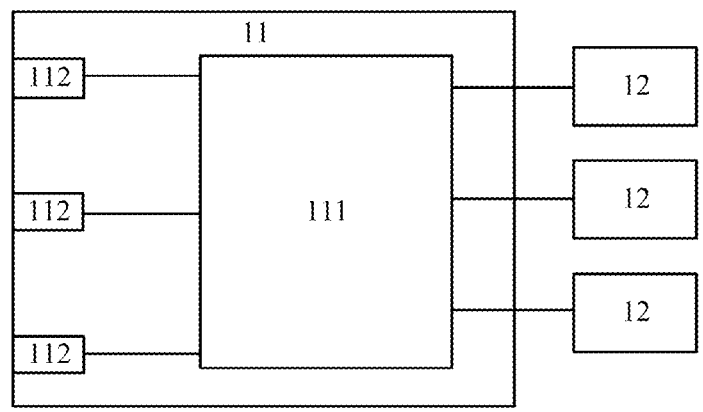
FIG. 1 is a schematic diagram of a fan box according to an embodiment of this application.

An embodiment of this application provides a fan box. As shown in FIG. 1, the fan box includes a fan box control board 11 and at least one fan 12. The fan box control board 11 includes a controller 111 and a plurality of communication interfaces 112. The controller 111 is electrically connected to the plurality of communication interfaces 112, and the controller 111 is electrically connected to the fan 12. The controller 111 is configured to receive a plurality of fan box speed adjustment instructions through the plurality of communication interfaces 112, determine a target rotation speed based on rotation speeds indicated by the plurality of fan box speed adjustment instructions, and adjust a rotation speed of the fan 12 to the target rotation speed, where one communication interface 112 of the plurality of communication interfaces 112 receives one fan box speed adjustment instruction.

The fan box control board 11 is a control unit of the fan box, including a board body, and a controller 111 and a communication interface 112 located on the board body.

The controller 111 is a control center of the fan box, and may be a central processing unit (CPU), or may be a field programmable gate array (FPGA), or the like. Because the fan box needs to support multi-master control, the controller 111 needs to support a plurality of threads to concurrently process communication with a plurality of server boards 2.

The communication interface 112 is an external communication interface of the fan box, and each communication interface 112 can be electrically connected to one server board 2, so that the fan box can be electrically connected to the plurality of server boards 2.

The fan 12 is an execution part of the fan box, and is configured to generate air for heat dissipation. One or more fans 12 may be provided, which is not specifically limited in this embodiment of this application.

Figure 2:
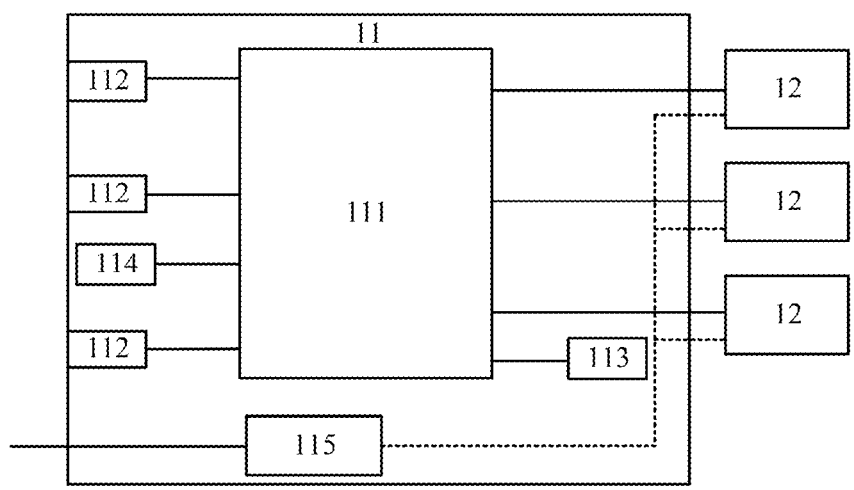
FIG. 2 is a schematic diagram of a fan box according to an embodiment of this application.

As shown in FIG. 2, in a specific implementation, the fan box control board 11 may further include a temperature sensor 113, a clock circuit 114, and a power supply soft-start circuit 115.

The temperature sensor 113 is electrically connected to the controller 111, and can detect a temperature value of the fan box and send the detected temperature value of the fan box to the controller 111. In addition, the fan box may also send the temperature value of the fan box to the server board 2, and the server board 2 receives the temperature value of the fan box and monitors the fan box. If the temperature value of the fan box is abnormal, the server board 2 reports alarm information, so that personnel can maintain or replace the fan box timely.

The clock circuit 114 is electrically connected to the controller 111. The clock circuit 114 is essentially an oscillation circuit that can generate an accurate motion like a clock, and generally includes a crystal oscillator, a crystal oscillator control chip, and a capacitor.

One end of the power supply soft-start circuit 115 is electrically connected to a plurality of fans 12 separately, and the other end is electrically connected to an external power supply. A function of the power supply soft-start circuit 115 is to ensure that when the fan box is hot-plugged, an excessively large current is avoided, to avoid affecting normal operation of the system because a 12 V bus on a backplane is suspended.

It should be noted that both dashed lines and solid lines in FIG. 2 represent electrical connections, and the dashed lines and the solid lines are used only to distinguish electrical connections between different components.

Figure 3:
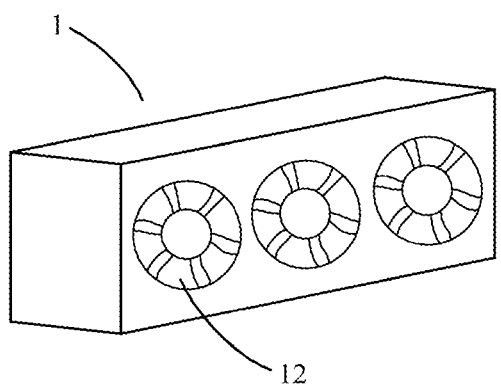
FIG. 3 is a schematic diagram of an outline of a fan box according to an embodiment of this application.

FIG. 3 is a schematic diagram of an outline of a fan box according to an embodiment of this application.

According to the solution shown in embodiments of this application, this embodiment of this application provides a fan box. The fan box includes a plurality of communication interfaces 112, and each communication interface 112 is configured to be electrically connected to one server board 2. Therefore, the fan box provided in this embodiment of this application can be electrically connected to a plurality of server boards 2, and is applicable to a multi-node server system of a central management unit-free architecture and any server system that has a multi-node master control requirement.

A controller 111 in the fan box may receive a plurality of fan box speed adjustment instructions, and rotation speeds indicated by the plurality of fan box speed adjustment instructions may be different. Therefore, the controller 111 needs to determine a target rotation speed of the fan 12 based on the rotation speeds indicated by the plurality of fan box speed adjustment instructions.

In a specific implementation, a largest rotation speed in the rotation speeds indicated by the plurality of fan box speed adjustment instructions may be determined as the target rotation speed, so that a heat dissipation air volume generated by the fan box can meet heat dissipation requirements of all server boards.

In another specific implementation, the target rotation speed may be further determined based on a rotation speed greater than the target rotation speed threshold in the rotation speeds indicated by the plurality of fan box speed adjustment instructions. Alternatively, when all rotation speeds indicated by the fan box speed adjustment instructions are less than the target rotation speed threshold, the target rotation speed threshold is determined as the target rotation speed. The target rotation speed threshold may be a minimum rotation speed specified by the fan 12. During running of the fan box, the fan 12 rotates at a rotation speed greater than or equal to the target rotation speed threshold.

When the target rotation speed is determined based on the rotation speed indicated by the fan box speed adjustment instruction, only a rotation speed greater than the target rotation speed threshold in the rotation speeds indicated by the fan box speed adjustment instructions may be considered, and a rotation speed less than the target rotation speed threshold is discarded, thereby preventing the determined target rotation speed being less than the target rotation speed threshold.

In embodiments of this application, a specific manner of determining the target rotation speed based on a rotation speed greater than the target rotation speed threshold in the rotation speeds indicated by the plurality of fan box speed adjustment instructions is not limited. For example, a largest rotation speed in rotation speeds greater than the target rotation speed threshold may be determined as the target rotation speed, or rotation speeds greater than the target rotation speed threshold may be averaged, and the average rotation speed is determined as the target rotation speed, or a median of rotation speeds greater than the target rotation speed threshold may be calculated, and a rotation speed in the median is determined as the target rotation speed.

When the rotation speeds indicated by the plurality of fan box speed adjustment instructions are all less than the target rotation speed threshold, the target rotation speed threshold is determined as the target rotation speed, to prevent the rotation speed of the fan 12 being less than the target rotation speed threshold.

The mode in which the fan box adjusts the rotation speed of the fan 12 under the control of the server board 2 may be referred to as a node control mode of the fan box.

Compared with the node control mode, the fan box may also have an automatic control mode. The automatic control mode of the fan box is described below.

During running of the fan box, external communication of the plurality of communication interfaces 112 of the fan box may be interrupted. In this case, the controller 111 may not receive the fan box speed adjustment instruction. In a specific implementation, the controller 111 is further configured to detect that the external communication of the plurality of communication interfaces 112 is interrupted, and adjust a rotation speed of at least one fan 12 based on a temperature value of the fan box.

To implement detection of external communication of the communication interface 112, a heartbeat detection mechanism may be set between each communication interface 112 and the server board 2. After detecting that heartbeat between the server 2 and a communication interface 112 is lost, the controller 111 determines that external communication of the communication interface 122 is interrupted. In addition, the server board 2 determines that the communication with the fan box is interrupted, and the server board 2 may send an alarm indicating that the communication with the fan box is interrupted to a customer interface, so that operation and maintenance personnel can replace the fan box or the server board 2 timely.

In a specific implementation, the temperature value of the fan box may be the temperature value detected by the temperature sensor 113.

It should be noted that, when the external communication of all the plurality of communication interfaces 112 is normal, the fan box enters the node control mode; and when the external communication of all the plurality of communication interfaces 112 is interrupted, the fan box enters the automatic control mode. However, when communication of some communication interfaces 112 of the plurality of communication interfaces 112 is interrupted and communication of the other communication interfaces 112 is normal, the fan box may enter the node control mode or may enter the automatic control mode. This is not specifically limited in this embodiment of this application. Several examples are used for described below.

(1) When it is detected that external communication of all the communication interfaces 112 is interrupted, the fan box enters the automatic control mode, and in other cases, the fan box enters the node control mode.

That is, if communication status of one server board 2 is normal, the fan box is in the node control mode.

(2) When it is detected that external communication of one communication interface 112 is interrupted, the fan box enters the automatic control mode.

(3) When it is detected that a quantity of the communication interfaces 112 whose external communication is interrupted is greater than a preset quantity, the fan box enters the automatic control mode, and when the external communication of the communication interfaces 112 is normal, or a quantity of the communication interfaces 112 whose external communication is interrupted is less than a preset quantity, the fan box enters the node control mode.

(4) When it is detected that a proportion of the communication interfaces 112 whose external communication is interrupted is greater than a preset proportion, the fan box enters the automatic control mode, and when the external communication of the communication interfaces 112 is normal, or a proportion of the communication interfaces 112 whose external communication is interrupted is less than a preset proportion, the fan box enters the node control mode.

The foregoing proportion refers to a proportion of a quantity of communication interfaces 112 whose communication is interrupted to all communication interfaces 112 of the fan box.

In addition, the server board 2 may further perform an upgrade operation on the fan box. To prevent interference to the upgrade operation of the fan box, in a specific implementation, the controller 111 is further configured to receive an upgrade instruction sent by a first server board, where the upgrade instruction indicates the fan box to perform the upgrade operation, send a status indication message to a second server board, where the status indication message indicates that the fan box is performing the upgrade operation, so that the second server board does not send the fan box speed adjustment instruction, the upgrade instruction, or another instruction to the fan box, both the first server board and the second server board are electrically connected to the fan box, and the first server board and the second server board are different server boards.

The fan box is designed to send the status indication message to the second server board, so that the fan box does not receive an instruction sent by the second server board during upgrade operation, thereby avoiding interfering with the upgrade operation of the fan box.

For example, through the foregoing design, the plurality of server boards do not perform the upgrade operation on the fan box at a same moment, thereby avoiding an upgrade conflict of the fan box.

Figure 4:
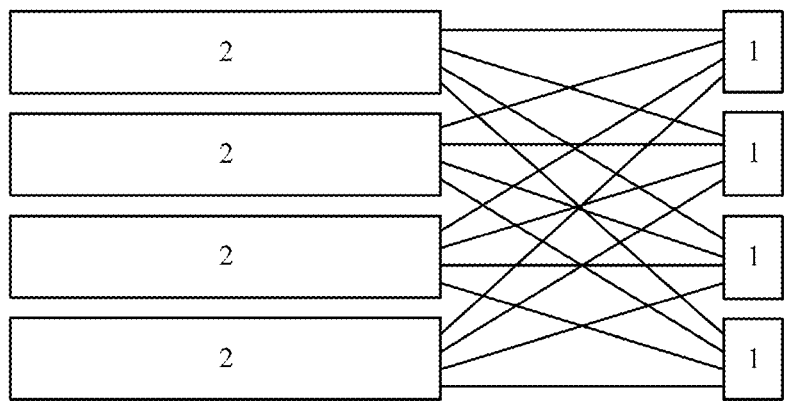
FIG. 4 is a schematic diagram of a server system according to an embodiment of this application.

An embodiment of this application further provides a server system. As shown in FIG. 4, the server system includes at least one fan box 1 and a plurality of server boards 2. The fan box 1 is electrically connected to the plurality of server boards 2. Each server board 2 is configured to send a fan box speed adjustment instruction to the fan box 1 based on a detected board temperature value. The fan box 1 is configured to adjust a rotation speed of the fan box based on the plurality of received fan box speed adjustment instructions.

The fan box 1 may be the foregoing fan box. The board temperature value refers to a temperature value of the server board 2, and may be a temperature value detected by a temperature sensor arranged on the server board 2. The rotation speed of the fan box refers to a rotation speed of a fan in the fan box.

Figure 5:
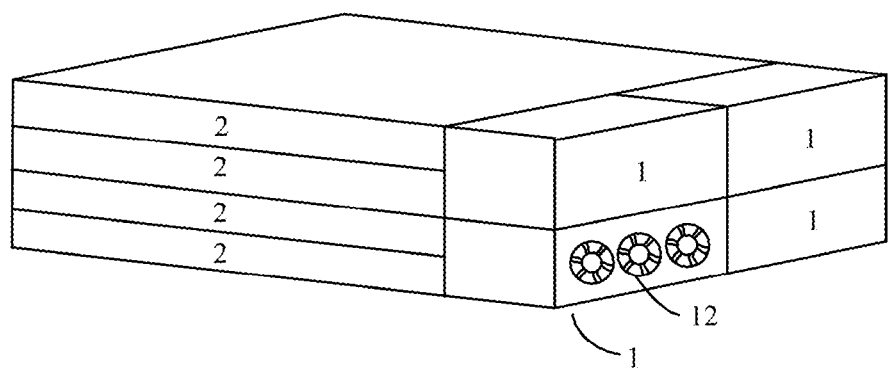
FIG. 5 is a schematic diagram of a multi-node blade server according to an embodiment of this application.

As shown in FIG. 5, the server system provided in this embodiment of this application may be a blade server system (blade server), or may be a rack server system, or the like. This is not limited in this embodiment of this application. When the server system is a blade server system, the fan box 1 is fixedly connected to a shelf of the blade server. For example, the blade server may be a multi-node blade server of a central management unit-free architecture. When the server system is a rack server system, the plurality of server boards 2 belong to a plurality of rack servers respectively, and the fan box 1 is fixedly connected to a rack on which the rack server is mounted.

The server board 2 may also be referred to as a node. The server board 2 is electrically connected to the fan box 1. For example, the server board 2 may provide N southbound interface components to communicate with N fan boxes 1, where N is a positive integer. The server board 2 can generate a fan box speed adjustment instruction based on the board temperature value, and send the fan box speed adjustment instruction to the fan box 1. For example, the server board 2 may detect an air intake vent temperature and an air exhaust vent temperature through a local temperature sensor, determine a rotation speed corresponding to the fan box 1 using a proportional integral differential (PID) control algorithm, and generate a fan box speed adjustment instruction carrying the rotation speed.

The fan box 1 can generate air for heat dissipation, and can adjust the rotation speed of the fan box based on the fan box speed adjustment instruction of the server board 2. The fan box 1 is electrically connected to the plurality of server boards 2. For example, each fan box 1 may provide M northbound interfaces to communicate with M server boards 2, where M is a positive integer greater than 1. In addition, the fan box 1 may further send a rotation speed value of the fan box to each server board 2.

According to the solution shown in embodiments of this application, this embodiment of this application provides a new server system. In the server system, the fan box 1 is electrically connected to all server boards 2. When controlling the fan box 1, each server board 2 considers the fan box 1 as a local fan box, and the plurality of server boards 2 provide equal management for the fan box 1, without fixing a shelf management unit (a central management board), thereby improving high integration and high space utilization of the server system.

In addition, the fan box 1 is electrically connected to all server boards 2 in the server system, so that redundancy and reliability of the server system are increased, and it is ensured that when a server board 2 or a fan box 1 fails, normal running of other server boards is not affected, thereby improving reliability of heat dissipation of the server system.

It should be noted that, in addition to that each fan box 1 is electrically connected to all the server boards 2 in the server system, the server system may also adopt other architectures. For example, the fan box 1 may also be electrically connected to only the server board 2 with a corresponding position in the server system.

Figure 6:
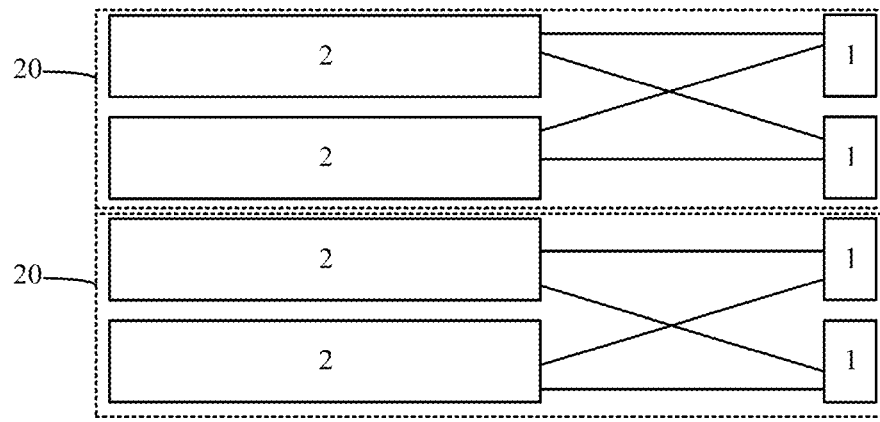
FIG. 6 is a schematic diagram of a server system according to an embodiment of this application.

In a specific implementation, as shown in FIG. 6, a plurality of fan boxes 1 are provided, the server system includes a plurality of heat dissipation areas 20, and each heat dissipation area 20 includes at least two server boards 2 and at least one fan box 1. For each heat dissipation area 20, each fan box 1 in the heat dissipation area 20 is corresponding to positions of all server boards in the heat dissipation area 20, and each fan box 1 in the heat dissipation area 20 is electrically connected to all server boards 2 in the heat dissipation area 20.

As shown in FIG. 6, for example, the server system includes two heat dissipation areas 20, and each heat dissipation area 20 includes two server boards 2 and two fan boxes 1. Each fan box 1 is electrically connected to both server boards 2 in the heat dissipation area 20 in which the fan box 1 is located, and is not electrically connected to server boards in other heat dissipation areas 20.

Each fan box 1 is set to be electrically connected to only the server board 2 with corresponding positions, so that a quantity of server boards 2 connected to the fan box 1 is relatively small, a quantity of communication interfaces 112 arranged in the fan box 1 may be relatively small, and costs of the fan box 1 are relatively low. In addition, the fan box 1 is connected only to the server board 2 in the local heat dissipation area, so that the server board 2 controls the fan box 1 more accurately, thereby avoiding interference from the server board 2 in the other heat dissipation areas.

Figure 7:
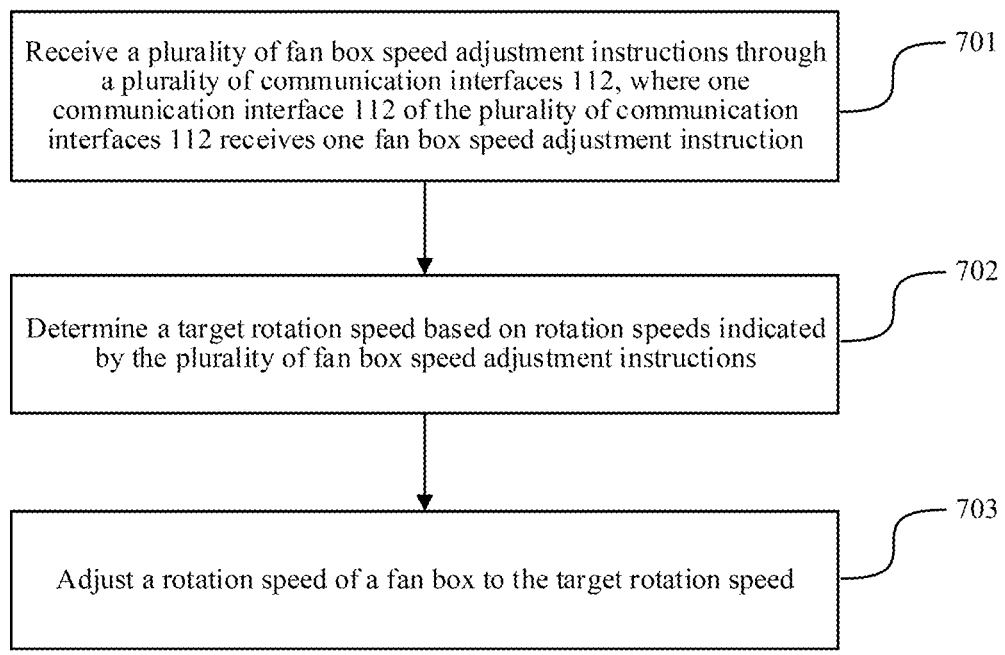
FIG. 7 is a flowchart of a method for adjusting a rotation speed of a fan box according to an embodiment of this application.

An embodiment of this application further provides a method for adjusting a rotation speed of a fan box. The fan box includes a plurality of communication interfaces 112. As shown in FIG. 7, the method includes the following steps.

Step 701: Receive a plurality of fan box speed adjustment instructions through the plurality of communication interfaces 112, where one communication interface 112 of the plurality of communication interfaces 112 receives one fan box speed adjustment instruction.

Step 702: Determine a target rotation speed based on rotation speeds indicated by the plurality of fan box speed adjustment instructions.

Step 703: Adjust a rotation speed of the fan box to the target rotation speed.

In a specific implementation, determining a target rotation speed based on rotation speeds indicated by the plurality of fan box speed adjustment instructions includes: determining a largest rotation speed in the rotation speeds indicated by the plurality of fan box speed adjustment instructions as the target rotation speed.

In a specific implementation, determining a target rotation speed based on rotation speeds indicated by the plurality of fan box speed adjustment instructions includes: determining a target rotation speed based on a rotation speed greater than the target rotation speed threshold in the speeds indicated by the plurality of fan box speed adjustment instructions; or determining the target rotation speed threshold as the target rotation speed when the speeds indicated by the plurality of fan box speed adjustment instructions are all less than the target rotation speed threshold.

In a specific implementation, the method further includes:
receiving an upgrade instruction sent by a first server board, where the upgrade instruction indicates a fan box to perform an upgrade operation; and
sending a status indication message to a second server board, where the status indication message indicates that the fan box is performing the upgrade operation, and both the first server board and the second server board are electrically connected to the fan box.

It should be noted that the method for adjusting a rotation speed of a fan box provided in this embodiment of this application may be applied to the fan box provided in this embodiment of this application.

An embodiment of this application further provides another method for adjusting a rotation speed of a fan box. The fan box includes a plurality of communication interfaces 112. The method includes the following steps.

A plurality of fan box speed adjustment instructions are received through the plurality of communication interfaces 112, a target rotation speed is determined based on rotation speeds indicated by the plurality of fan box speed adjustment instructions, a rotation speed of the fan box is adjusted to the target rotation speed, and one communication interface 112 of the plurality of communication interfaces 112 receives one fan box speed adjustment instruction; or when external communication of the plurality of communication interfaces 112 is interrupted, a rotation speed of the fan box is adjusted based on a temperature value of the fan box.

In a specific implementation, the fan box further includes a temperature sensor 113. Before the rotation speed of the fan box is adjusted based on the temperature value of the fan box, the method further includes: obtaining the temperature value of the fan box detected by the temperature sensor 113.

It should be noted that the method for adjusting a rotation speed of a fan box provided in this embodiment of this application may be applied to the fan box provided in this embodiment of this application.

An embodiment of this application further provides a computer-readable storage medium. The computer-readable storage medium includes instructions, and when the computer-readable storage medium runs on a fan box, the fan box is enabled to perform any method for adjusting a rotation speed of a fan box provided in embodiments of this application.

An embodiment of this application further provides a computer program product including instructions. When the computer program product runs on a fan box, the fan box performs any method for adjusting a rotation speed of a fan box provided in embodiments of this application.

An embodiment of this application further provides a chip. The chip includes a programmable logic circuit and/or program instructions. When the chip runs, the chip is configured to implement any method for adjusting a rotation speed of a fan box provided in embodiments of this application.

In embodiments of this application, the terms "first" and "second" are merely intended for description, and shall not be understood as an indication or implication of relative importance. A term "a plurality of" means two or more, unless otherwise expressly limited.

The foregoing descriptions are only optional embodiments of this application, but are not intended to limit this application. Any modification, equivalent replacement, or improvement made within the principle of this application should fall within the protection scope of this application.

What is claimed is:

1. A fan box, wherein the fan box comprises a fan box control board and at least one fan;
   the fan box control board comprises a controller and a plurality of communication interfaces, the controller is electrically connected to the plurality of communication interfaces, and the controller is electrically connected to the at least one fan; and
   the controller is configured to receive a plurality of fan box speed adjustment instructions through the plurality of communication interfaces, determine a target rotation speed based on rotation speeds indicated by the plurality of fan box speed adjustment instructions, and adjust a rotation speed of the at least one fan to the target rotation speed, wherein one communication interface of the plurality of communication interfaces receives one fan box speed adjustment instruction and adjust the rotation speed of the at least one fan based on a temperature value of the fan box when it is detected that external communication of the plurality of communication interfaces is interrupted.

2. The fan box according to claim 1, wherein when determining the target rotation speed based on the rotation speeds indicated by the plurality of fan box speed adjustment instructions, the controller is configured to:
   determine a largest rotation speed in the rotation speeds indicated by the plurality of fan box speed adjustment instructions as the target rotation speed.

3. The fan box according to claim 1, wherein when determining the target rotation speed based on the rotation speeds indicated by the plurality of fan box speed adjustment instructions, the controller is configured to perform one of:
   determine the target rotation speed based on a rotation speed greater than a target rotation speed threshold in the rotation speeds indicated by the plurality of fan box speed adjustment instructions; or
   determine the target rotation speed threshold as the target rotation speed when the speeds indicated by the plurality of fan box speed adjustment instructions are all less than the target rotation speed threshold.

4. The fan box according to claim 1, wherein the fan box control board further comprises a temperature sensor, and the temperature sensor is electrically connected to the controller;
   the temperature sensor is configured to detect the temperature value of the fan box; and
   before adjusting the rotation speed of the at least one fan based on the temperature value of the fan box, the controller is further configured to:
   obtain the temperature value detected by the temperature sensor.

5. The fan box according to claim 1, wherein the controller is further configured to:
   receive an upgrade instruction sent by a first server board, wherein the upgrade instruction indicates the fan box to perform an upgrade operation; and
   send a status indication message to a second server board, wherein the status indication message indicates that the fan box is performing the upgrade operation, and both the first server board and the second server board are electrically connected to the fan box.

6. A server system, wherein the server system comprises at least one fan box and a plurality of server boards;
   the fan box is electrically connected to the plurality of server boards;
   each server board is configured to send a fan box speed adjustment instruction to the fan box based on a detected board temperature value; and
   the fan box is configured to adjust a rotation speed of the fan box based on the plurality of received fan box speed adjustment instructions and adjust the rotation speed of at least one fan based on a temperature value of the fan box when it is detected that external communication of a plurality of communication interfaces is interrupted.

7. The server system according to claim 6, wherein the server system is a blade server, and the at least one fan box is fixedly connected to a shelf of the blade server.

8. A method for adjusting a rotation speed of a fan box, wherein the fan box comprises a plurality of communication interfaces, and the method comprises:
   receiving a plurality of fan box speed adjustment instructions through the plurality of communication interfaces, wherein one communication interface of the plurality of communication interfaces receives one fan box speed adjustment instruction;
   determining a target rotation speed based on rotation speeds indicated by the plurality of fan box speed adjustment instructions;
   adjusting a rotation speed of the fan box to the target rotation speed; and
   receiving an upgrade instruction sent by a first server board, wherein the upgrade instruction indicates the fan box to perform an upgrade operation; and
   sending a status indication message to a second server board, wherein the status indication message indicates that the fan box is performing the upgrade operation, and both the first server board and the second server board are electrically connected to the fan box.

9. The method according to claim 8, wherein the determining a target rotation speed based on rotation speeds indicated by the plurality of fan box speed adjustment instructions comprises:
   determining a largest rotation speed in the rotation speeds indicated by the plurality of fan box speed adjustment instructions as the target rotation speed.

10. The method according to claim 8, wherein the determining a target rotation speed based on rotation speeds indicated by the plurality of fan box speed adjustment instructions comprises one of:
    determining the target rotation speed based on a rotation speed greater than a target rotation speed threshold in the rotation speeds indicated by the plurality of fan box speed adjustment instructions; or determining the target rotation speed threshold as the target rotation speed when the speeds indicated by the plurality of fan box speed adjustment instructions are all less than the target rotation speed threshold.

* * * * *